(12) United States Patent
Okamoto

(10) Patent No.: US 8,681,904 B2
(45) Date of Patent: Mar. 25, 2014

(54) RECEIVER, RECEPTION METHOD, PROGRAM AND RECEPTION SYSTEM

(75) Inventor: Takuya Okamoto, Chiba (JP)

(73) Assignee: Sony Corporation, Tokyo (JP)

( * ) Notice: Subject to any disclaimer, the term of this patent is extended or adjusted under 35 U.S.C. 154(b) by 104 days.

(21) Appl. No.: 13/403,239

(22) Filed: Feb. 23, 2012

(65) Prior Publication Data

US 2012/0250802 A1 Oct. 4, 2012

(30) Foreign Application Priority Data

Mar. 31, 2011 (JP) ................................. 2011-078821

(51) Int. Cl.
*H04L 27/06* (2006.01)
(52) U.S. Cl.
USPC .......................................... 375/340; 333/149
(58) Field of Classification Search
USPC .......... 375/340, 345, 296, 298; 330/149, 285, 330/278; 455/126, 127.3; 448/723, 726
See application file for complete search history.

(56) References Cited

U.S. PATENT DOCUMENTS

| 2009/0245088 A1 | 10/2009 | Takeuchi et al. |
| 2010/0238358 A1* | 9/2010 | Ma et al. ........................ 348/725 |
| 2010/0272219 A1 | 10/2010 | Andgart et al. |
| 2011/0199207 A1 | 8/2011 | Ikeda et al. |
| 2011/0200145 A1 | 8/2011 | Ikeda et al. |
| 2011/0200146 A1 | 8/2011 | Ikeda et al. |
| 2011/0280381 A1 | 11/2011 | Okamoto et al. |
| 2012/0212675 A1* | 8/2012 | Shukla et al. ................. 348/723 |

FOREIGN PATENT DOCUMENTS

EP 2 073 473 A1 6/2009

OTHER PUBLICATIONS

Digital Video Broadcasting (DVB): "Frame structure channel coding and modulation for a second generation digital transmission system for cable systems (DVB-C2)", DVB Document A138, Jun. 2010, 111 pages.
Extended European Search Report issued Aug. 10, 2012 in Patent Application No. 12160494.6.
"Digital Video Broadcasting (DVB); Frame Structure Channel Coding and Modulation for a Second Generation Digital Transmission System for Cable Systems (DVB-C2)", European Telecommunications Standards Institute (ETSI), XP-014061785, Vol. BROADCAS, No. V1.2.1, Dec. 1, 2010, pp. 1-111.
J. Robert et al., "DVB-C2—The Standard for Next Ganeration Digital Cable Transmission", IEEE International Symposium on Broadband Multimedia Systems and Broadcasting, 2009, XP-031480164, May 13, 2009, pp. 1-5.

* cited by examiner

*Primary Examiner* — Khai Tran
(74) *Attorney, Agent, or Firm* — Sony Corporation

(57) ABSTRACT

Disclosed herein is a receiver including a determination block adapted to determine, as a gain used to adjust the power of a received signal received with a fixed bandwidth, a gain different from that used when other band is not contained in a band of the received signal if the band of the received signal contains a desired signal band and the other band.

9 Claims, 14 Drawing Sheets

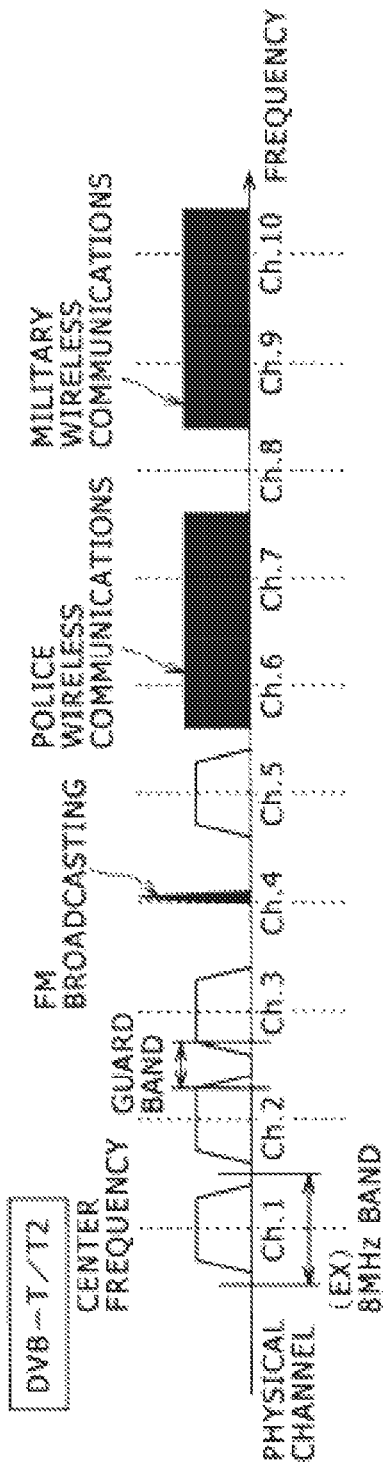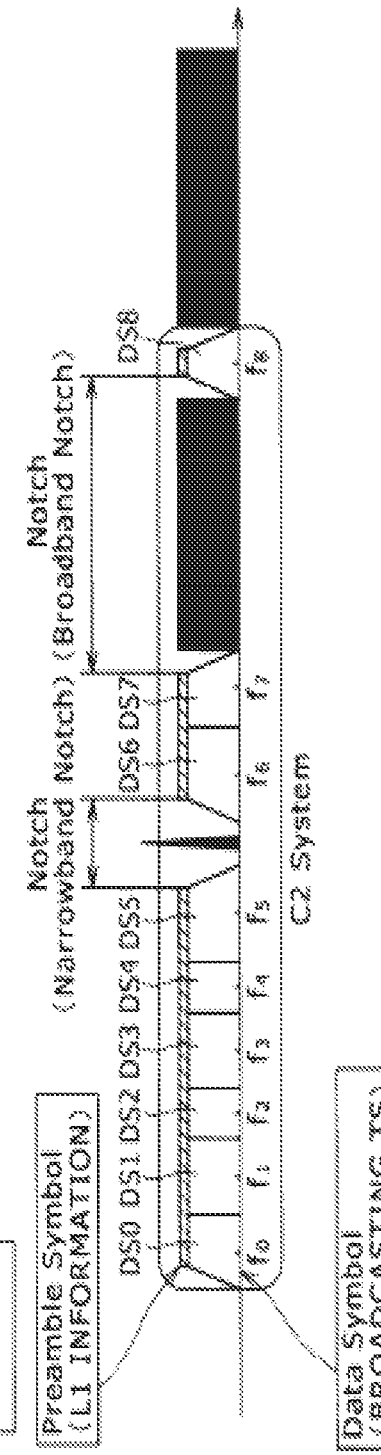

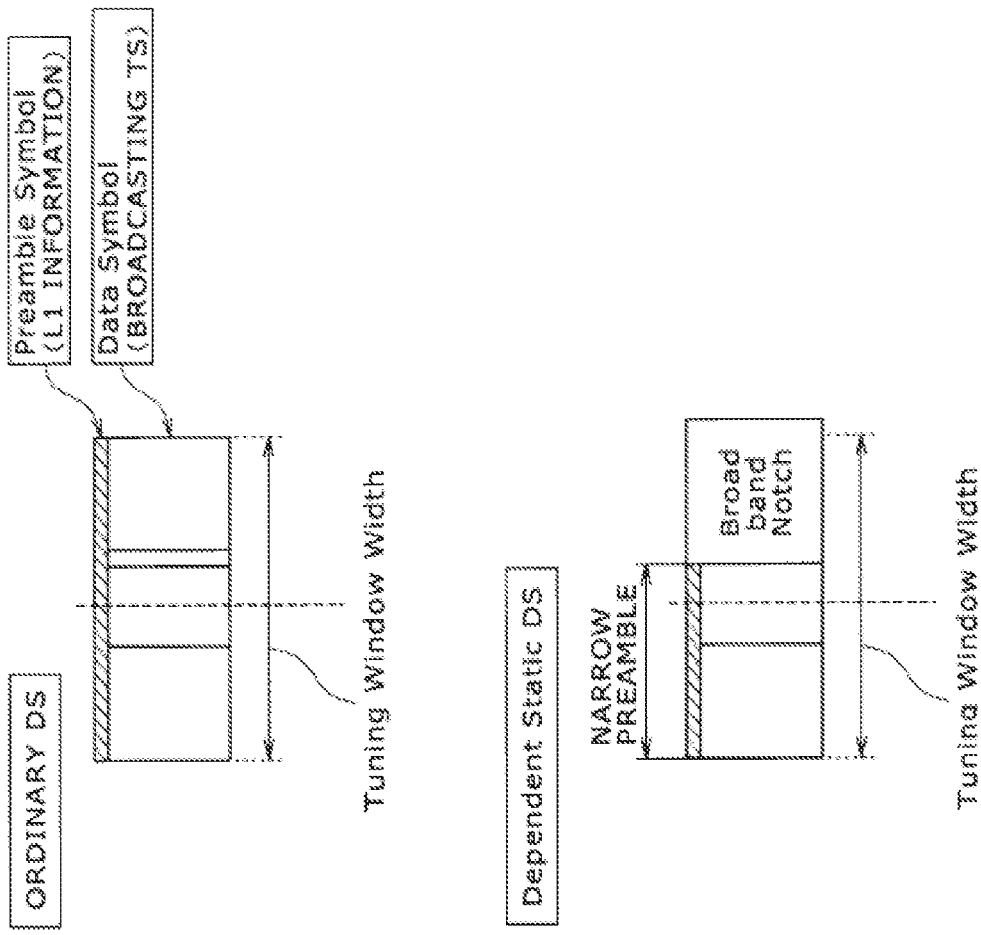

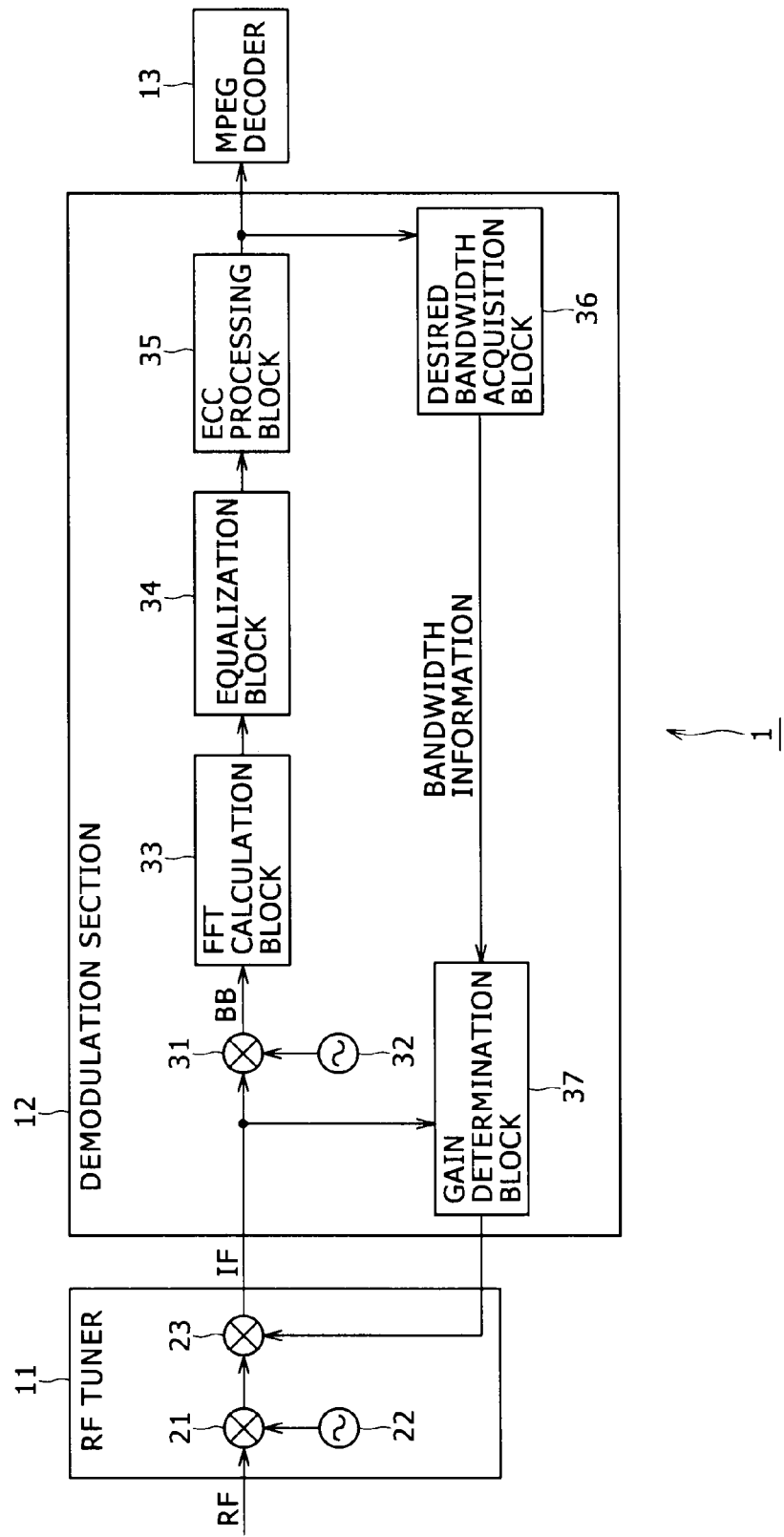

FIG. 5

| | Field | Size(bits) |
|---|---|---|
| 1 | NETWORK_ID | 16 |
| 2 | C2_SYSTEM_ID | 16 |
| 3 | START_FREQUENCY | 24 |
| 4 | C2_BANDWIDTH | 16 |
| 5 | GUARD_INTERVAL | 2 |
| 6 | C2_FRAME_LENGTH | 10 |
| 7 | L1_PART2_CHANGE_COUNTER | 8 |
| 8 | NUM_DSLICE | 8 |
| 9 | NUM_NOTCH | 4 |
| 10 | for i=0.. NUM_DSLICE-1 { | |
| 11 |     DSLICE_ID | 8 |
| 12 |     DSLICE_TUNE_POS | 14 or 13 |
| 13 |     DSLICE_OFFSET_LEFT | 9 or 8 |
| 14 |     DSLICE_OFFSET_RIGHT | 9 or 8 |
| 15 |     DSLICE_TI_DEPTH | 2 |
| 16 |     DSLICE_TYPE | 1 |
| 17 |     if DSLICE_TYPE=='1' { | |
| 18 |         FEC_HEADER_TYPE | 1 |
| 19 |     } | |
| 20 |     DSLICE_CONST_CONF | 1 |
| 21 |     DSLICE_LEFT_NOTCH | 1 |
| 22 |     DSLICE_NUM_PLP | 8 |
| 23 |     for i=0.. DSLICE_NUM_PLP-1 { | |
| 24 |         PLP_ID | 8 |
| 25 |         PLP_BUNDLED | 1 |
| 26 |         PLP_TYPE | 2 |
| 27 |         PLP_PAYLOAD_TYPE | 5 |
| 28 |         if PLP_TYPE=='00' or '01' { | |
| 29 |             PLP_GROUP_ID | 8 |
| 30 |         } | |
| 31 |         if DSLICE_TYPE=='0' { | |
| 32 |             PLP_START | 14 |
| 33 |             PLP_FEC_TYPE | 1 |
| 34 |             PLP_MOD | 3 |
| 35 |             PLP_COD | 3 |
| 36 |         } | |
| 37 |         PSI/SI_REPROCESSING | 1 |
| 38 |         if PSI/SI_REPROCESSING=='0' { | |
| 39 |             transport_stream_id | 16 |
| 40 |             original_network_id | 16 |
| 41 |         } | |
| 42 |         RESERVED_1 | 8 |
| 43 |     } | |
| 44 |     RESERVED_2 | 8 |
| 45 | } | |
| 46 | for i=0.. NUM_NOTCH-1 { | |
| 47 |     NOTCH_START | 14 or 13 |
| 48 |     NOTCH_WIDTH | 9 or 8 |
| 49 |     RESERVED_3 | 8 |
| 50 | } | |
| 51 | RESERVED_TONE | 1 |
| 52 | RESERVED_4 | 16 |

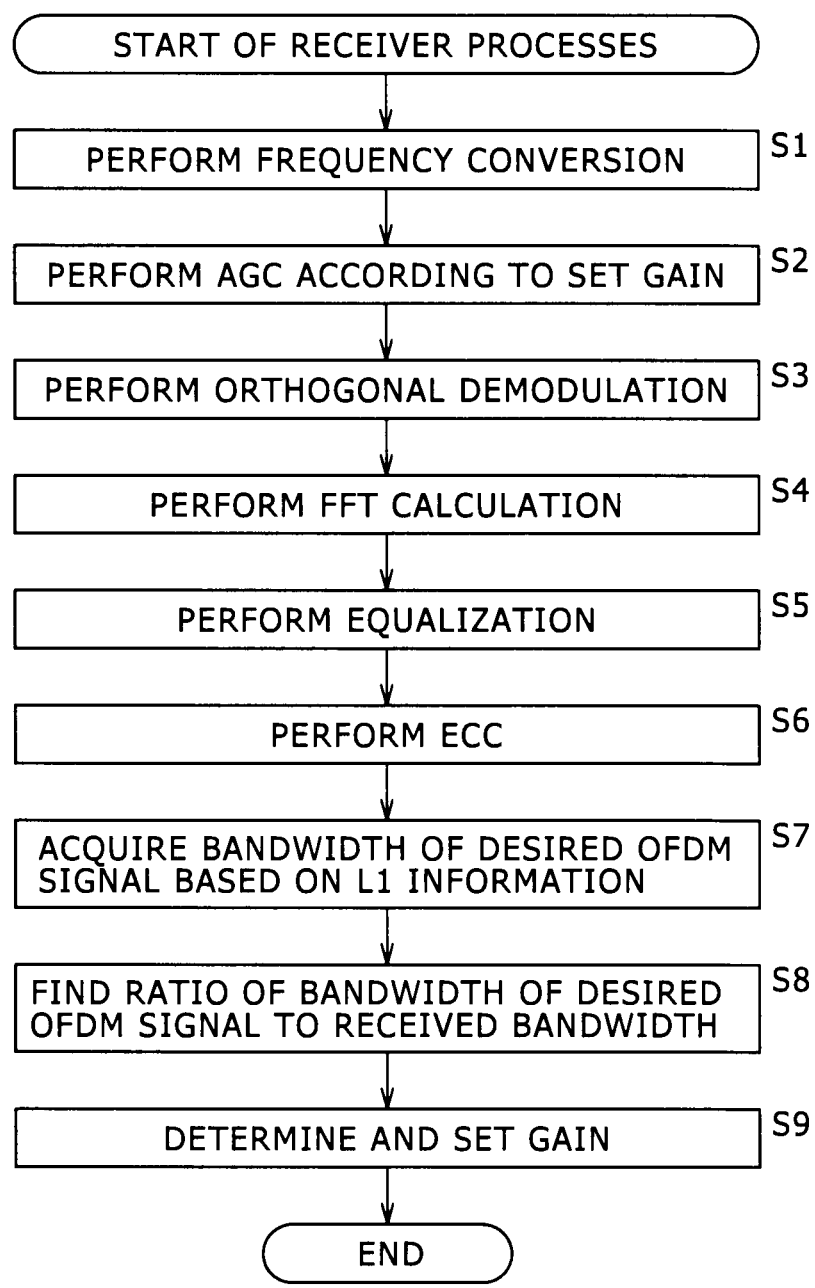

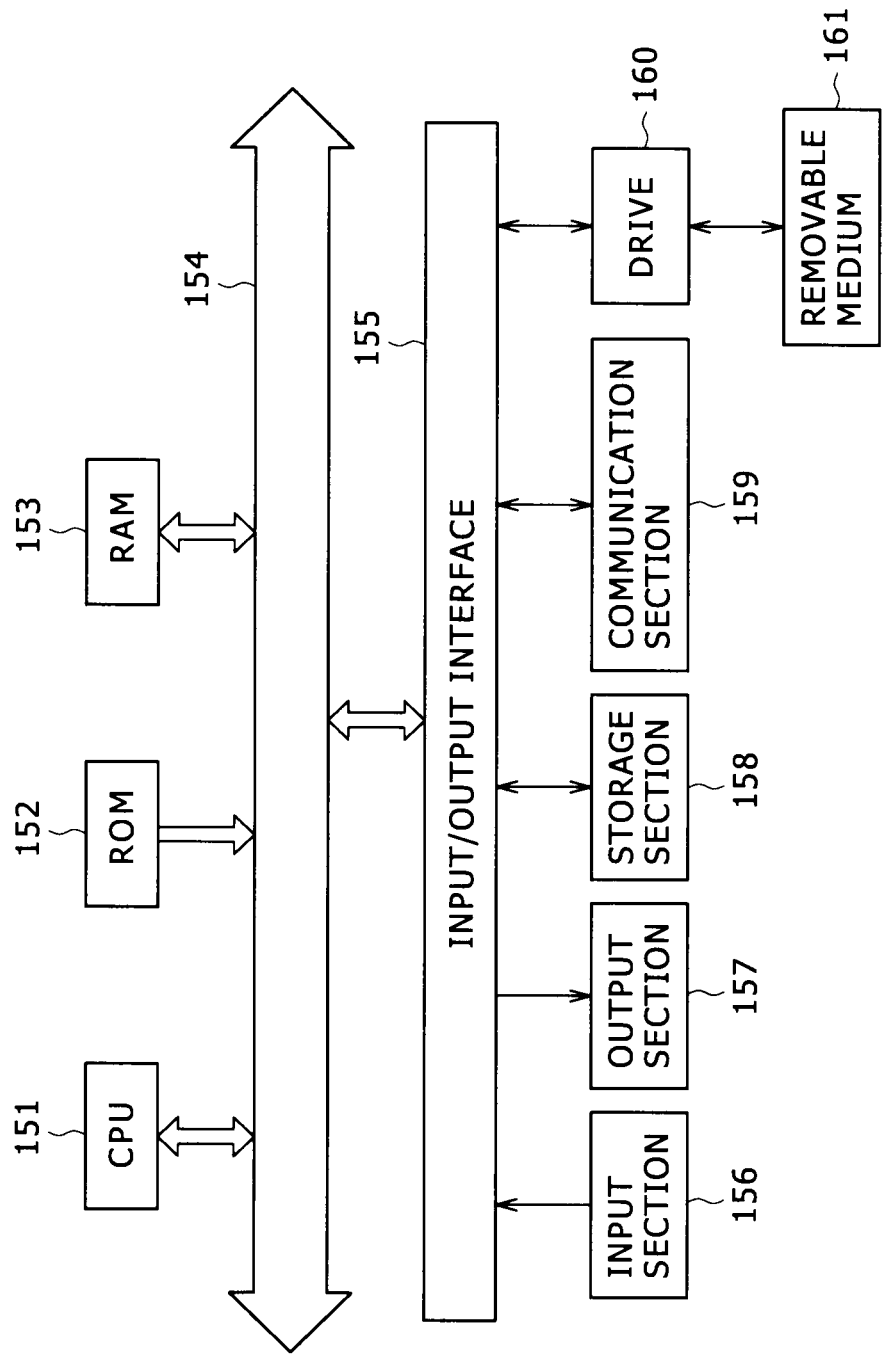

RECEIVER, RECEPTION METHOD, PROGRAM AND RECEPTION SYSTEM

BACKGROUND

The present technology relates to a receiver, reception method, program and reception system that can provide improved reception performance for receiving a signal with a variable bandwidth.

In terrestrial digital broadcasting, for example, channels (physical channels) are generally defined to be spaced at constant frequency intervals so as to transmit independent signals with bandwidths prescribed by laws and regulations. A guard band with a given bandwidth is established between each pair of adjacent channels in order to prevent, for example, interchannel interference.

In the case of DVB-T/T2 (Digital Video Broadcasting-Terrestrial/Terrestrial 2), i.e., the European terrestrial digital broadcasting standard, for example, the channels are each 8 MHz in bandwidth as illustrated in FIG. 1A. Receivers are designed based on the premise that signals with a predetermined bandwidth will be transmitted.

In the event of presence of an interference wave in some channels (physical channels) of a band, transmission operators that transmitted signals using such a transmission system have chosen not to use the entire band, thus resulting in wasteful use of a frequency band.

Incidentally, DVB-C2 (Digital Video Broadcasting-Cable 2) that was standardized in 2010 as the European second generation cable digital broadcasting standard includes an arrangement adapted to avoid such a waste (refer to DVB-C2 Standard Document [Digital Video Broadcasting (DVB); Frame structure channel coding and modulation for a second generation digital transmission system for cable systems (DVB-C2)] DVB Document A138, hereinafter referred to as Non-Patent Document 1).

As illustrated in FIG. 1B, DVB-C2 supports the concept of data slices, and a predetermined number of such data slices are combined together to make up a C2 system. The data slices are each 3408 carriers or less in bandwidth and may be freely combined as long as the conditions specified by the standard are met.

DVB-C2 also supports the concept of notches. Transmission operators can define the band unavailable due, for example, to external interference as a notch and include subcarrier-by-subcarrier notch position information in the C2 system.

FIG. 2A is a diagram illustrating an example of a DVB-T/T2 signal, and FIG. 2B is a diagram illustrating an example of a DVB-C2 signal. In FIGS. 2A and 2B, the horizontal axis represents the frequency. A description will be given below of a DVB-C2 signal.

As enclosed by a line in FIG. 2B, a C2 system includes a preamble symbol and data symbol. As far as the standard is concerned, one C2 system is a signal having a bandwidth of up to about 3.5 GHz.

A preamble symbol is used to transmit transmission control information called L1 signalling part 2 data (L1 information). The L1 information will be described in detail later. The same information is repeatedly transmitted at intervals of 3408 carriers (3408 OFDM (Orthogonal Frequency Division Multiplex) subcarriers) using a preamble symbol. The 3408 carriers correspond to a 7.61 MHz frequency band.

A data symbol is used to transmit transport streams (TS) such as program data. A data symbol is divided for each data slice. For example, data slice 1 (DS1) and data slice 2 (DS2) carry different pieces of program data. The parameters relating to each data slice such as the data slice count are contained in L1 information.

The portions filled with black in FIG. 2B are notches. Notches are frequency bands used, for example, for FM broadcasting, police wireless communications and military wireless communications, and are not used to transmit C2 system signals. In a transmission signal output from the transmitter, the notch periods are signal-free periods. Notches can be classified into two types, narrowband notches of less than 48 carriers in bandwidth and broadband notches of 48 carriers or more in bandwidth. The parameters relating to each notch such as the notch count and bandwidth are contained in L1 information.

As described above, a DVB-C2 signal has "data slices" and "notches" that are variable in bandwidth. It is necessary for the receiver to demodulate an OFDM signal whose bandwidth is selected almost at will by the transmitting side. In DVB-C2, the desired width of a data slice may be smaller than 3408 carriers. The desired data slice count is acquired from L1 information during channel scan.

The reception process by the receiver is conducted by receiving a signal within a tuning window with a fixed bandwidth (3409 carriers) as illustrated in FIG. 3A. The center position (center frequency) of the tuning window suitable for receiving a desired data slice signal is specified by the transmitting side.

The receiver demodulates the OFDM signal by orthogonally demodulating the signal using a signal whose frequency has been specified by the transmitting side. The program data is decoded based on the L1 information obtained from the demodulation.

SUMMARY

An ordinary receiver automatically adjusts its gain using its AGC (Auto Gain Control) function to reduce the quantization noise. The gain adjustment is conducted so that the smaller the power of the signal supplied to the receiver, the higher the gain is adjusted, and the greater the signal power, the lower the gain is adjusted.

A receiver compliant, for example, with DVB-T/T2 receives signals with a constant bandwidth. Therefore, there would be no problem even if the gain adjustment parameters were the same in each time.

However, it is necessary for a receiver compliant, for example, with DVB-C2 to change the gain adjustment setting depending on how much a desired OFDM signal is contained in the band of the received signal. That is, the power of a signal fed to the receiver varies depending, for example, on whether there is a notch in the band of the received signal.

If the AGC is performed without changing the gain adjustment parameter setting so as to maintain the target power constant, and if there is an OFDM signal across the band of the received signal, the power per carrier is small, possibly resulting in large quantization noise. Conversely, if there is an OFDM signal in part of the band of the received signal with no signal in the rest of the band, the power per carrier is large, possibly resulting in overflow.

It should be noted that the situation in which a broadband notch is included in the band of the received signal in DVB-C2 basically only occurs when the data slice to be received is a dependent static DS. Here, the expression "dependent static DS" refers to, so to speak, a DS which is a slave of other DS because a dependent static DS can only be demodulated after the L1 information is obtained from the band of other data slice (DS).

A dependent static DS is a data slice such as DS8 shown in FIG. 2B which is separate from a group of other data slices. No matter how a tuning window is selected to receive a dependent static DS, there is a broadband notch within the band of the received signal as illustrated in FIG. 3B or a portion outside the band of the C2 system. Even if the band including the dependent static DS is received and demodulated, it is not guaranteed that L1 information can be decoded.

The present technology has been made in light of the foregoing, and it is desirable to ensure improved reception performance for receiving a signal with a variable bandwidth.

According to an embodiment of the present technology, there is provided a receiver including a determination block adapted to determine, as a gain used to adjust the power of a received signal received with a fixed bandwidth, a gain different from that used when other band is not contained in a band of the received signal if the band of the received signal contains a desired signal band and the other band.

According to another embodiment of the present technology, there is provided a reception method including determining, as a gain used to adjust the power of a received signal received with a fixed bandwidth, a gain different from that used when other band is not contained in a band of the received signal if the band of the received signal contains a desired signal band and the other band.

According to still another embodiment of the present technology, there is provided a program for causing a computer to perform a process including determining, as a gain used to adjust the power of a received signal received with a fixed bandwidth, a gain different from that used when other band is not contained in a band of the received signal if the band of the received signal contains a desired signal band and the other band.

According to yet another embodiment of the present technology, there is provided a reception system including: a reception section adapted to receive a signal with a fixed bandwidth in a predetermined frequency band, the signal being transmitted via a channel; a demodulation section adapted to demodulate the received signal received by the reception section; a signal processing section adapted to perform signal processing of the data demodulated by the demodulation section to obtain data to be transmitted; and an output section adapted to output the data to be transmitted obtained by the signal processing section, wherein the demodulation section includes a determination block adapted to determine, as a gain used to adjust the power of the received signal received by the reception section, a gain different from that used when other band is not contained in a band of the received signal if the band of the received signal contains a desired signal band and the other band.

The other band includes a band used for transmission of a predetermined signal other than the desired signal and a signal-free band.

The receiver may be a single IC chip, a component including an integrated circuit (IC) chip or a device made up of a component including an IC chip.

The present technology ensures improved reception performance for receiving a signal with a variable bandwidth.

BRIEF DESCRIPTION OF THE DRAWINGS

FIGS. 2A and 2B are diagrams illustrating examples of a C2 system;

FIG. 3 is a diagram illustrating examples of received signals;

FIG. 4 is a block diagram illustrating a first configuration example of a receiver;

FIG. 5 is a diagram illustrating parameters included in L1 information;

FIG. 8 is a flowchart describing the operation of the receiver shown in FIG. 4;

FIG. 14 is a diagram illustrating a configuration example of a computer.

DETAILED DESCRIPTION OF THE PREFERRED EMBODIMENTS

Figure 1A:
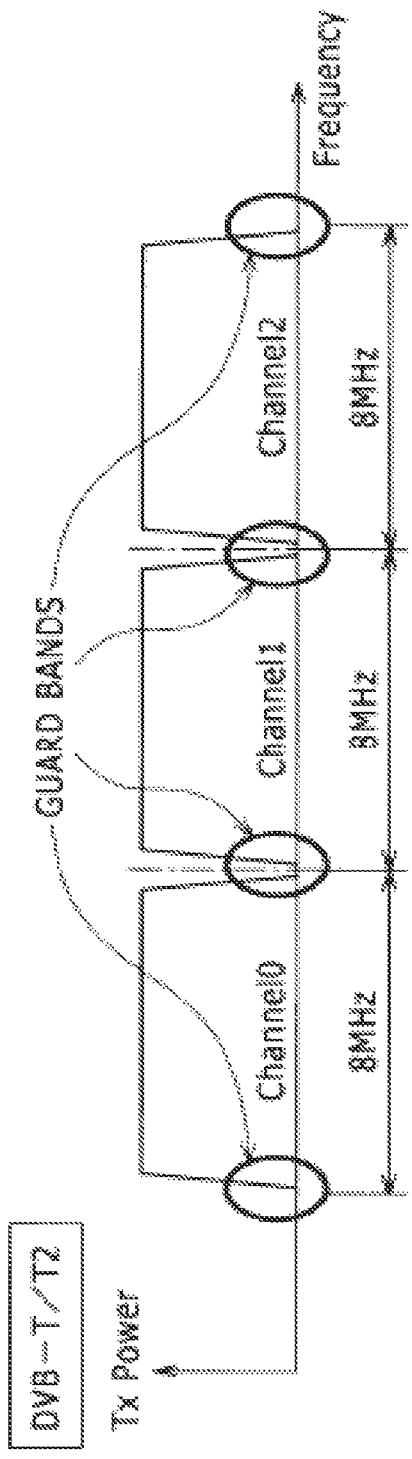
FIGS. 1A and 1B are diagrams illustrating spectra of DVB-T/T2 and DVB-C2 signals.
Figure 1B:
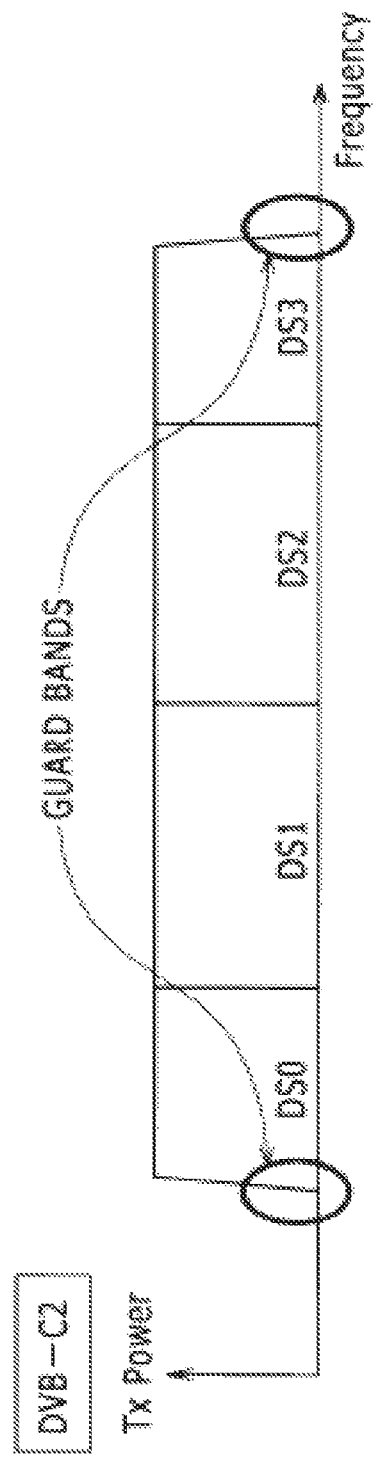

A description will be given below of the preferred embodiments of the present technology. The description will be given in the following order.

1. First embodiment (example in which AGC (Automatic Gain Control) is performed by the RF (Radio Frequency) tuner)

2. Second embodiment (example in which AGC is performed by the demodulation section)

3. Third embodiment (another example in which AGC is performed by the demodulation section)

4. Fourth embodiment (example in which part of the band is suppressed using a filter)

5. Modification example

First Embodiment

[Configuration Example of the Receiver]

FIG. 4 is a block diagram illustrating a first configuration example of the receiver according to an embodiment of the present technology.

A receiver 1 shown in FIG. 4 can receive an OFDM signal of DVB-C2. The receiver 1 includes an RF tuner 11, demodulation section 12 and MPEG (Moving Picture Experts Group) decoder 13.

The RF tuner 11 includes a frequency conversion block 21, oscillator 22 and AGC (Automatic Gain Control) block 23. The demodulation section 12 includes an orthogonal demodulation block 31, oscillator 32, FFT (Fast Fourier Transform) calculation block 33, equalization block 34, ECC (Error Correcting Code) processing block 35, desired bandwidth acquisition block 36 and gain determination block 37. An RF (Radio Frequency) signal representing an OFDM signal of DVB-C2 fed via a cable circuit is fed to the frequency conversion block 21 of the RF tuner 11.

The frequency conversion block 21 of the RF tuner 11 receives the fed RF signal, frequency-converting the RF signal based on the signal at a predetermined frequency supplied from the oscillator 22. The frequency conversion block 21 outputs the IF (Intermediate Frequency) signal obtained from frequency conversion to the AGC block 23.

The oscillator 22 generates a signal at a predetermined frequency, outputting the signal to the frequency conversion block 21.

The AGC block 23 adjusts the power of the IF signal according to the gain set by the gain determination block 37, outputting the IF signal whose power has been adjusted. The IF signal output from the AGC block 23 is supplied to the orthogonal demodulation block 31 and gain determination block 37.

The orthogonal demodulation block 31 of the demodulation section 12 orthogonally demodulates the IF signal supplied from the AGC block 23 based on the signal supplied from the oscillator 32. The orthogonal demodulation block 31 outputs a baseband signal obtained from the orthogonal demodulation to the FFT calculation block 33. The baseband signal is a time-domain signal representing symbols such as preamble and data symbols making up a C2 system.

The oscillator 32 generates a signal at the same frequency as the center frequency of the band of the received signal, outputting the signal to the orthogonal demodulation block 31.

The FFT calculation block 33 performs FFT calculation on the baseband signal supplied from the orthogonal demodulation block 31, outputting a frequency-domain signal to the equalization block 34.

The equalization block 34 extracts a pilot symbol from the frequency-domain signal supplied from the FFT calculation block 33, thus estimating the channel characteristics based on the extracted pilot symbol. The equalization block 34 removes distortion from the channel based on the estimated channel characteristics, thus equalizing the frequency-domain signal supplied from the FFT calculation block 33 and outputting the equalized signal to the ECC processing block 35.

The ECC processing block 35 performs error correction decoding of the data of each of the symbols based on the BCH (Bose-Chaudhuri-Hocquenghem) and LDPC (Low Density Parity Check) codes contained in the equalized signal supplied from the equalization block 34, thus outputting the error-correction-decoded data. The ECC processing block 35 outputs L1 information and TS data obtained from the error correction decoding. The L1 information and TS data are supplied to the desired bandwidth acquisition block 36 and MPEG decoder 13.

The desired bandwidth acquisition block 36 finds the bandwidth of the desired OFDM signal in the received band based on the L1 information supplied from the ECC processing block 35. The desired OFDM signal is the OFDM signal of DVB-C2 contained in the band of the received signal. The desired OFDM signal also includes the OFDM signal of the data slice to be received.

FIG. 5 is a diagram illustrating parameters included in L1 information. A description will be given below of the major parameters.

"START_FREQUENCY" in the third row represents the frequency that serves as a start position of the C2 system. The start position is expressed by an absolute frequency starting from 0 Hz. "C2_BANDWIDTH" in the fourth row represents the bandwidth of the C2 system.

"NUM_DSLICE" in the eighth row represents the number of data slices contained in the C2 frame. "NUM_NOTCH" in the ninth row represents the number of notches contained in the C2 frame. The parameters from the tenth to 45th rows are given for each data slice.

"DSLICE_ID" in the 11th row represents the ID of the data slice in the C2 system. "DSLICE_TUNE_POS" in the 12th row represents the center position of the tuning window adapted to receive the desired data slice with respect to the frequency represented by "START_FREQUENCY."

The parameters from the 46th to 50th rows are given for each notch. "NOTCH_START" in the 47th row represents the position of the notch with respect to the frequency represented by "START_FREQUENCY."

The desired bandwidth acquisition block 36 identifies the band of the received signal based on the position of the tuning window. Tuning windows are fixed in width or 3409 carriers wide. The desired bandwidth acquisition block 36 identifies, based on NOTCH_START and NOTCH_WIDTH, whether a notch is included in the band of the received signal.

If a notch is included in the band of the received signal, the desired bandwidth acquisition block 36 regards the band other than that of the notch as a band of the desired OFDM signal and finds the width thereof.

Figure 6A:
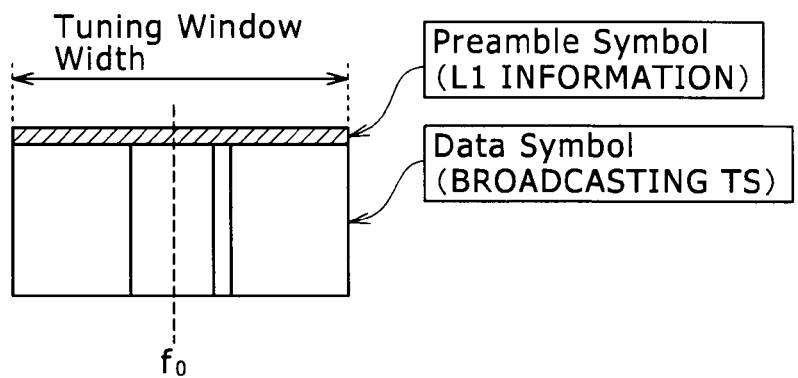
FIGS. 6A and 6B are diagrams illustrating examples of received signals.
Figure 6B:
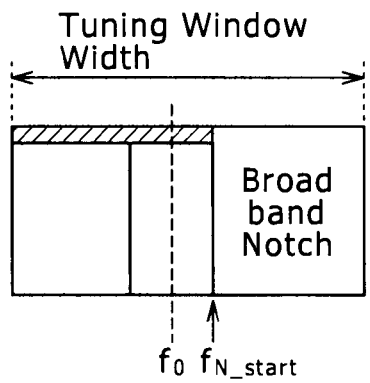

FIGS. 6A and 6B are diagrams illustrating examples of received signals. If no notch is included in the band of the received signal having a frequency $f_o$ at its center position as illustrated in FIG. 6A, the desired bandwidth acquisition block 36 identifies, for example, that the bandwidth of the desired OFDM signal in the received band is 3409 carriers, outputting information indicating the bandwidth of the desired OFDM signal to the gain determination block 37.

If a notch (broadband notch) is included in the band of the received signal having the frequency $f_o$ at its center position as illustrated in FIG. 6B, the desired bandwidth acquisition block 36 regards the band other than that of the notch as a band of the desired OFDM signal, outputting information indicating the bandwidth of the desired OFDM signal to the gain determination block 37. The data slice shown in FIG. 6B is a dependent static DS. A frequency $f_{N\_start}$, i.e., the start position of the notch, is represented by NOTCH_START included in L1 information. How far the notch extends from the start position, i.e., the frequency $f_{N\_start}$, is represented by NOTCH_WIDTH.

It should be noted that L1 information used to identify the bandwidth of the desired OFDM signal is that received when a data slice (ordinary data slice) which is not a dependent static DS is received. In DVB-C2, if the data slice to be received is contained in the whole or part of a dependent static DS, an ordinary data slice is received first. L1 information can be decoded when an ordinary data slice is received. A dependent static DS is received using L1 information at the time of reception of the ordinary data slice. As described above, even if a signal in the band containing a dependent static DS is received and demodulated, L1 information may not always be successfully decoded.

The gain determination block 37 finds the ratio of the bandwidth of the desired OFDM signal to the received bandwidth by dividing the bandwidth of the desired OFDM signal by the received bandwidth based on information supplied from the desired bandwidth acquisition block 36. The gain determination block 37 determines a gain commensurate with the ratio of the bandwidth of the desired OFDM signal to the received bandwidth, feeding back and setting the AGC block 23 of the RF tuner 11 to the determined gain.

Figure 7A:
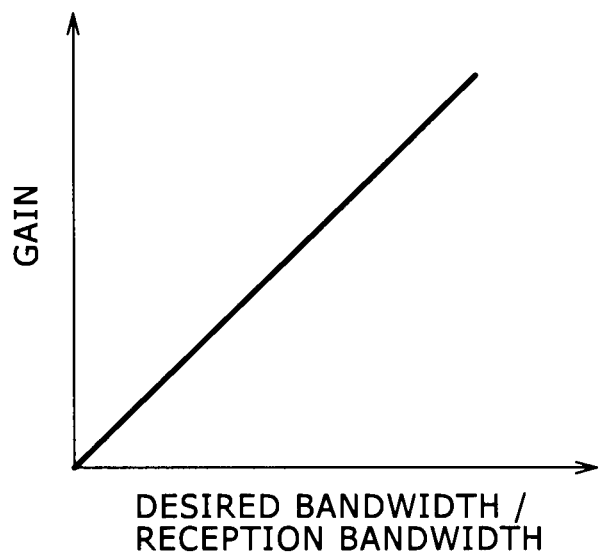
FIGS. 7A and 7B are diagrams illustrating examples of relationships between the ratio of the bandwidth of a desired OFDM signal to a received bandwidth and a gain.
Figure 7B:
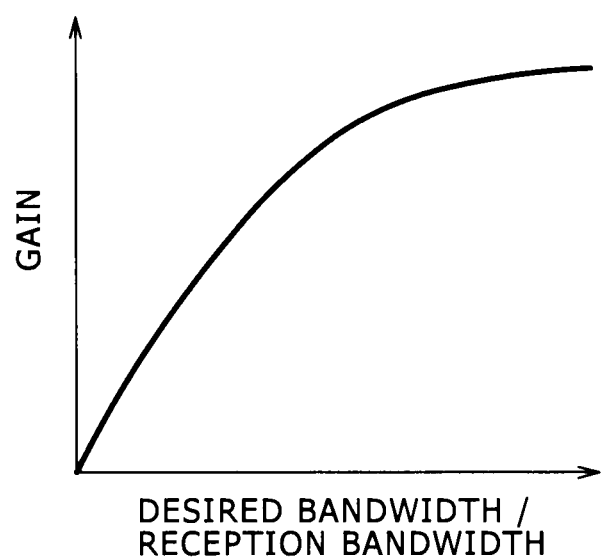

FIGS. 7A and 7B are diagrams illustrating examples of relationships between the ratio of the bandwidth of the desired OFDM signal to the received bandwidth and the gain. The relationship between the ratio of the bandwidth of the desired OFDM signal to the received bandwidth and the gain varies depending on the characteristics of the amplifier making up the AGC block 23.

FIG. 7A illustrates a case in which the amplifier making up the AGC block 23 has a characteristic that provides a linear relationship between the gain and the ratio of the bandwidth of the desired OFDM signal to the received bandwidth. In this case, the gain determination block 37 sets the AGC block 23 to a gain that is proportional to the ratio of the bandwidth of the desired OFDM signal to the received bandwidth.

FIG. 7B illustrates a case in which the amplifier making up the AGC block 23 has a characteristic that provides a non-linear relationship between the gain and the ratio of the bandwidth of the desired OFDM signal to the received bandwidth. In this case, the gain determination block 37 finds a gain commensurate with the ratio of the bandwidth of the desired OFDM signal to the received bandwidth based on a predetermined conversion formula found in advance, thus setting the AGC block 23 to the gain.

Referring back to the description of FIG. 4, the MPEG decoder 13 decodes the data contained in the TS packet making up the TS supplied from the ECC processing block 35, outputting the decoded data to the subsequent stage. The data contained in the TS packet is compressed according to a prescribed scheme such as MPEG2.

As described above, the receiver 1 is set to one of two different gains, one when the band of the desired OFDM signal exists in only part of the received band and another when the band of the desired OFDM signal exists across the received band.

This provides almost constant power output of the AGC block 23 irrespective of whether a notch is included in the band of the received signal, thus ensuring high precision in AD (Analog-to-Digital) conversion and other processes performed by a processing section not shown.

[Operation of the Receiver]

A description will be given below of the operation of the receiver 1 configured as described above with reference to the flowchart shown in FIG. 8. Each of the processes in the steps shown in FIG. 8 is performed in parallel with or before or after the process of other step as appropriate.

In step S1, the frequency conversion block 21 of the RF tuner 11 converts the frequency of the RF signal.

In step S2, the AGC block 23 adjusts the power of the IF signal supplied from the frequency conversion block 21 according to the gain set by the gain determination block 37.

In step S3, the orthogonal demodulation block 31 of the demodulation section 12 orthogonally demodulates the IF signal supplied from the AGC block 23.

In step S4, the FFT calculation block 33 performs FFT calculation on the time-domain baseband signal obtained from the orthogonal demodulation.

In step S5, the equalization block 34 equalizes the frequency-domain signal obtained from the FFT calculation.

In step S6, the ECC processing block 35 performs error correction decoding of the equalized signal.

In step S7, the desired bandwidth acquisition block 36 finds the bandwidth of the desired OFDM signal based on L1 information obtained from the error correction decoding.

In step S8, the gain determination block 37 finds the ratio of the bandwidth of the desired OFDM signal to the received bandwidth based on the bandwidth of the desired OFDM signal found by the desired bandwidth acquisition block 36.

In step S9, the gain determination block 37 determines a gain commensurate with the ratio of the bandwidth of the desired OFDM signal to the received bandwidth, setting the AGC block 23 to the determined gain. The AGC block 23 adjusts the power of the IF signal according to the gain set by the gain determination block 37.

The above series of processes provide almost constant power output of the AGC block 23 irrespective of whether a notch is included in the band of the received signal, thus contributing to improved reception performance.

Second Embodiment

Figure 9:
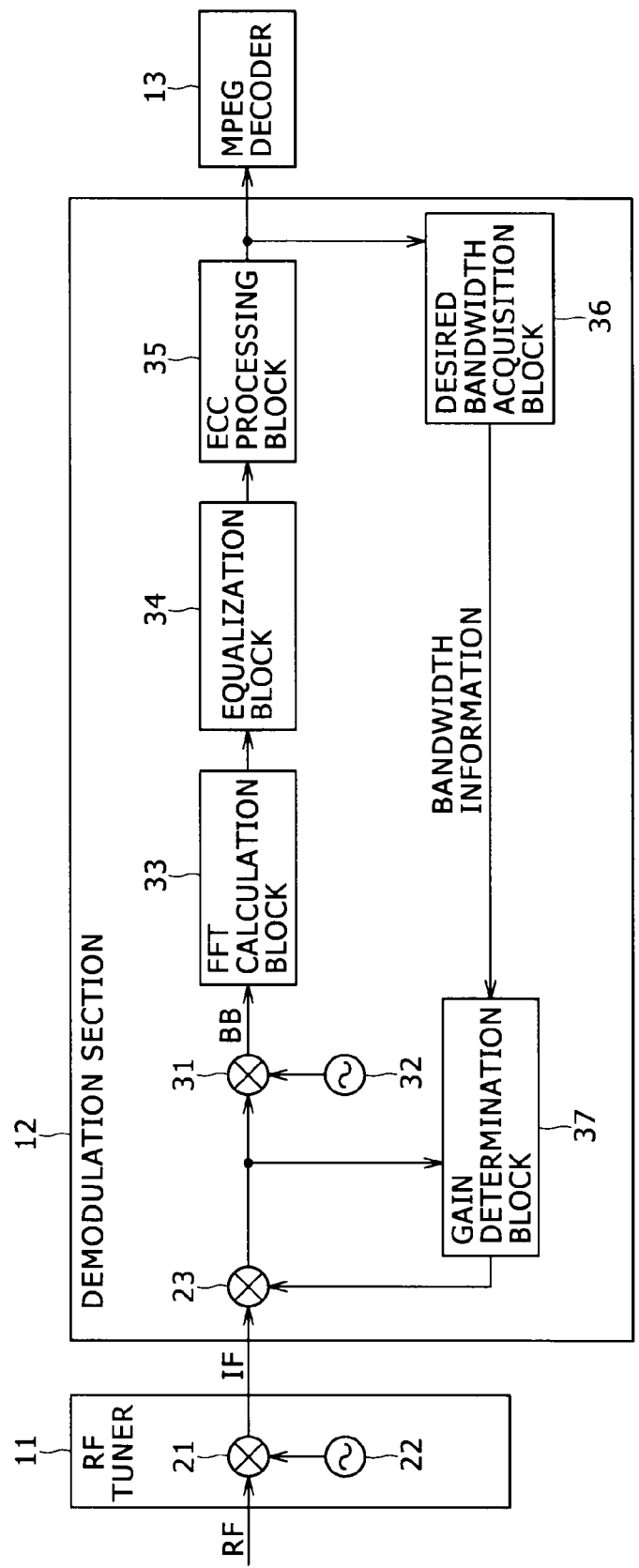
FIG. 9 is a block diagram illustrating a second configuration example of the receiver.

FIG. 9 is a block diagram illustrating a second configuration example of the receiver 1.

Of all the components shown in FIG. 9, those identical to the components shown in FIG. 4 are denoted by the same reference numerals. The configuration of the receiver 1 shown in FIG. 9 differs from that shown in FIG. 4 in that the AGC block 23 is provided in the demodulation section 12 rather than in the RF tuner 11. Redundant description will be omitted as appropriate.

The AGC block 23 of the demodulation section 12 adjusts the power of the IF signal supplied from the frequency conversion block 21 of the RF tuner 11 according to the gain set by the gain determination block 37, outputting the IF signal whose power has been adjusted to the orthogonal demodulation block 31 and gain determination block 37.

The gain determination block 37 finds the ratio of the bandwidth of the desired OFDM signal to the received bandwidth based on the information supplied from the desired bandwidth acquisition block 36, setting the AGC block 23 to the gain commensurate with the found ratio.

As described above, the AGC block 23 may be provided in the portion of the demodulation section 12 adapted to process an IF signal.

Third Embodiment

Figure 10:
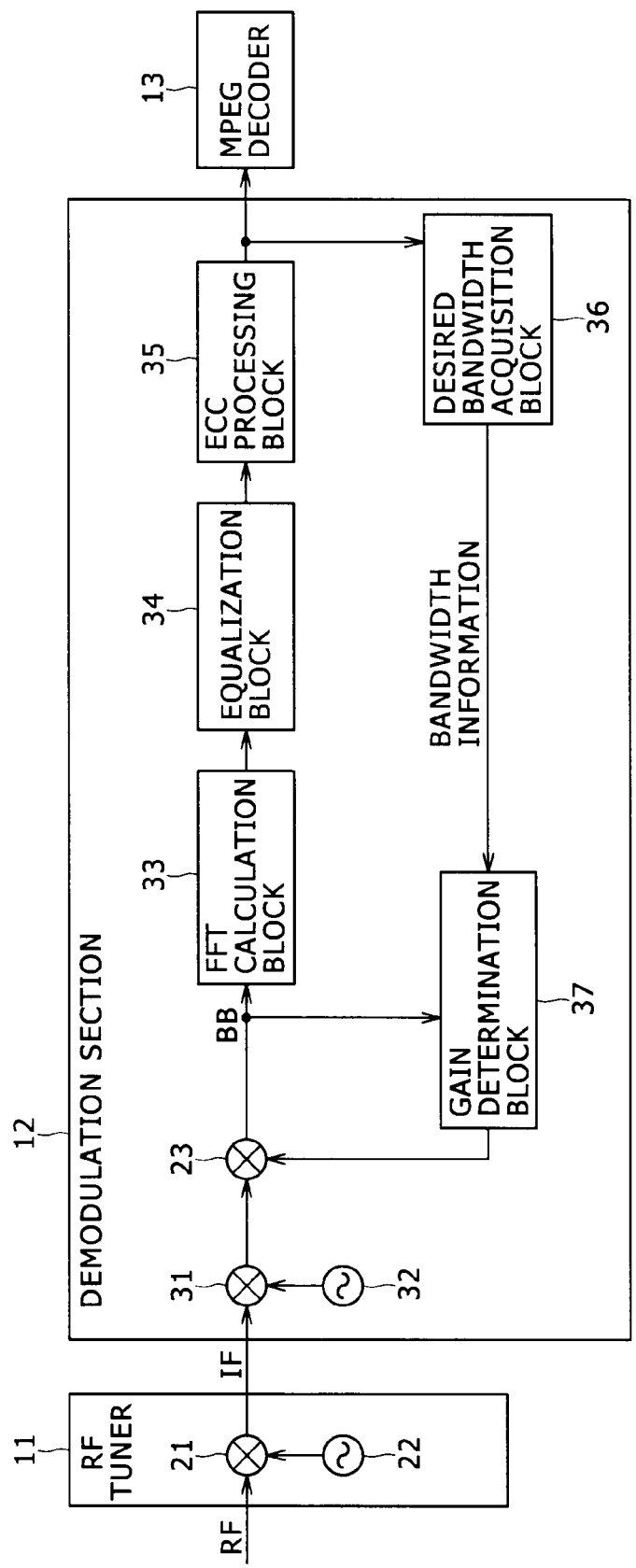
FIG. 10 is a block diagram illustrating a third configuration example of the receiver.

FIG. 10 is a block diagram illustrating a third configuration example of the receiver 1.

Of all the components shown in FIG. 10, those identical to the components shown in FIG. 4 or 9 are denoted by the same reference numerals. Redundant description will be omitted as appropriate. The configuration of the receiver 1 shown in FIG. 10 differs from that shown in FIG. 9 in that the AGC block 23 is provided at the subsequent stage of the orthogonal demodulation block 31 in the demodulation section 12. In FIG. 9, the AGC block 23 is provided at the previous stage of the orthogonal demodulation block 31 in the demodulation section 12.

The orthogonal demodulation block 31 of the demodulation section 12 orthogonally demodulates the IF signal supplied from the frequency conversion block 21 of the RF tuner 11. The orthogonal demodulation block 31 outputs a time-domain baseband signal, obtained from the orthogonal demodulation, to the AGC block 23.

The AGC block 23 adjusts the power of the time-domain baseband signal supplied from the orthogonal demodulation block 31 according to the gain set by the gain determination block 37, outputting the baseband signal whose power has been adjusted. The baseband signal output from the AGC block 23 is supplied to the FFT calculation block 33 and gain determination block 37.

The FFT calculation block 33 performs FFT calculation on the baseband signal supplied from the AGC block 23, outputting a frequency-domain signal to the equalization block 34.

As described above, the AGC block 23 may be provided in the portion of the demodulation section 12 adapted to process a baseband signal.

Fourth Embodiment

[Configuration Example of the Receiver]

Figure 11:
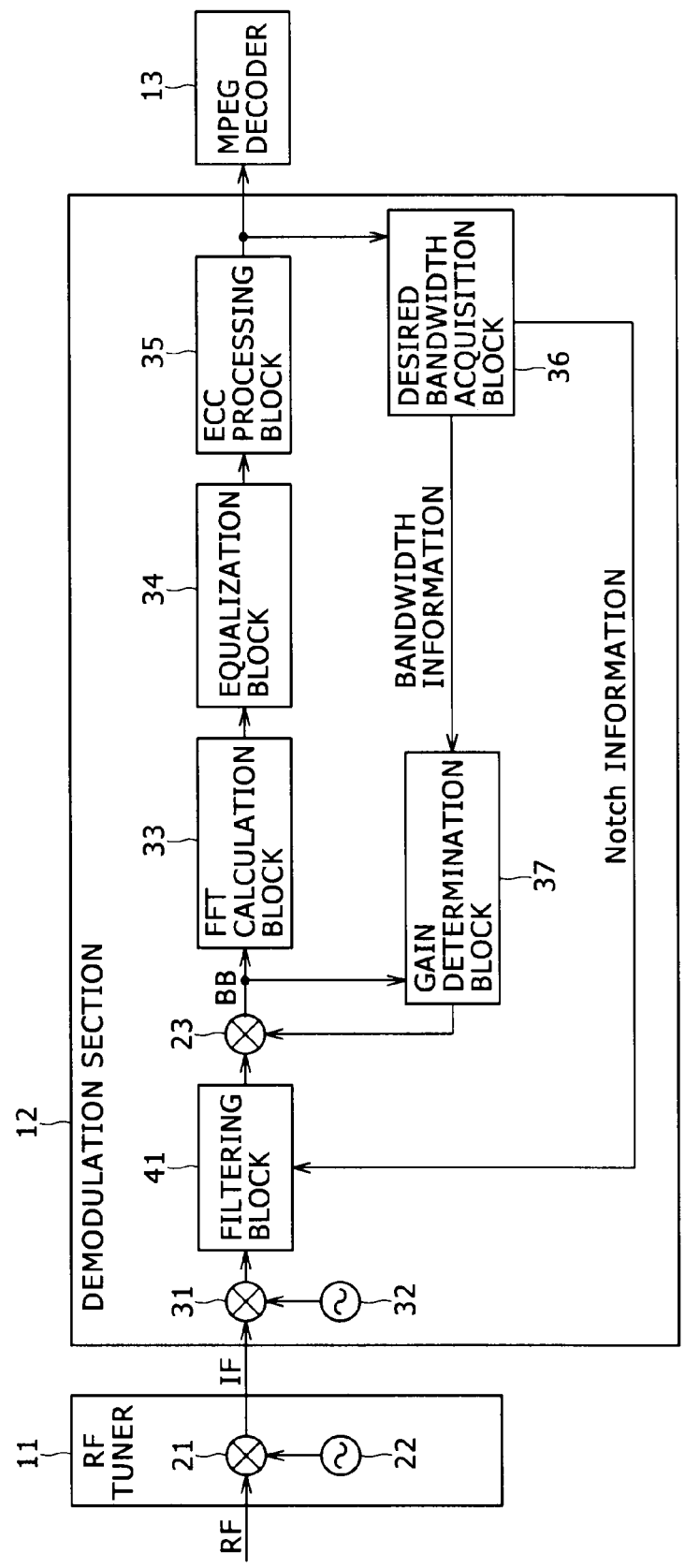
FIG. 11 is a block diagram illustrating a fourth configuration example of the receiver.

FIG. 11 is a block diagram illustrating a fourth configuration example of the receiver 1.

Of all the components shown in FIG. 11, those identical to the components shown in FIG. 10 are denoted by the same reference numerals. Redundant description will be omitted as appropriate. The configuration of the receiver 1 shown in FIG. 11 differs from that shown in FIG. 10 in that a filtering block 41 is provided at the subsequent stage of the orthogonal demodulation block 31 and at the previous stage of the AGC block 23.

The orthogonal demodulation block 31 of the demodulation section 12 orthogonally demodulates the IF signal supplied from the frequency conversion block 21 of the RF tuner 11. The orthogonal demodulation block 31 outputs a time-domain baseband signal, obtained from the orthogonal demodulation, to the filtering block 41.

The filtering block 41 identifies the band other than that of the desired OFDM signal contained in the received band based on the notch-related information supplied from the desired bandwidth acquisition block 36, suppressing the signals in the identified band. The filtering block 41 outputs a baseband signal in which signals in the band other than that of the desired OFDM signal have been suppressed, to the AGC block 23.

The AGC block 23 adjusts the power of the time-domain baseband signal supplied from the filtering block 41 according to the gain set by the gain determination block 37, outputting a baseband signal whose power has been adjusted. The baseband signal output from the AGC block 23 is supplied to the FFT calculation block 33 and gain determination block 37.

The desired bandwidth acquisition block 36 finds the bandwidth of the desired OFDM signal based on the L1 information supplied from the ECC processing block 35, outputting information indicating the bandwidth of the desired OFDM signal to the gain determination block 37. Further, the desired bandwidth acquisition block 36 outputs, to the filtering block 41, information indicating the position of the notch in the received band identified based on the L1 information.

The filtering block 41 performs filtering adapted to suppress the band containing the notch based on the information supplied from the desired bandwidth acquisition block 36. Information indicating the position of the desired OFDM signal in the received band rather than that indicating the position of the notch may be output from the desired bandwidth acquisition block 36 to the filtering block 41.

Practically, it is likely that external interference may exist in the band other than that of the desired OFDM signal. Because the power of external interference also affects the gain, such an external interference signal should preferably be suppressed by filtering prior to the AGC. Suppressing external interference prior to the AGC contributes to minimization of quantization noise, thus providing improved reception performance.

The filtering block 41 may be provided at other position such as in the RF tuner 11 shown in FIG. 11 so long as the filtering block 41 is provided at the previous stage of the AGC block 23. The filtering block 41 can be provided at the previous stage of the AGC block 23 shown in FIG. 4 or that shown in FIG. 9.

[Operation of the Receiver]

A description will be given below of the operation of the receiver 1 having the configuration shown in FIG. 11 with reference to the flowchart shown in FIG. 12. Each of the processes in the steps shown in FIG. 12 is performed in parallel with or before or after the process of other step as appropriate.

Figure 12:
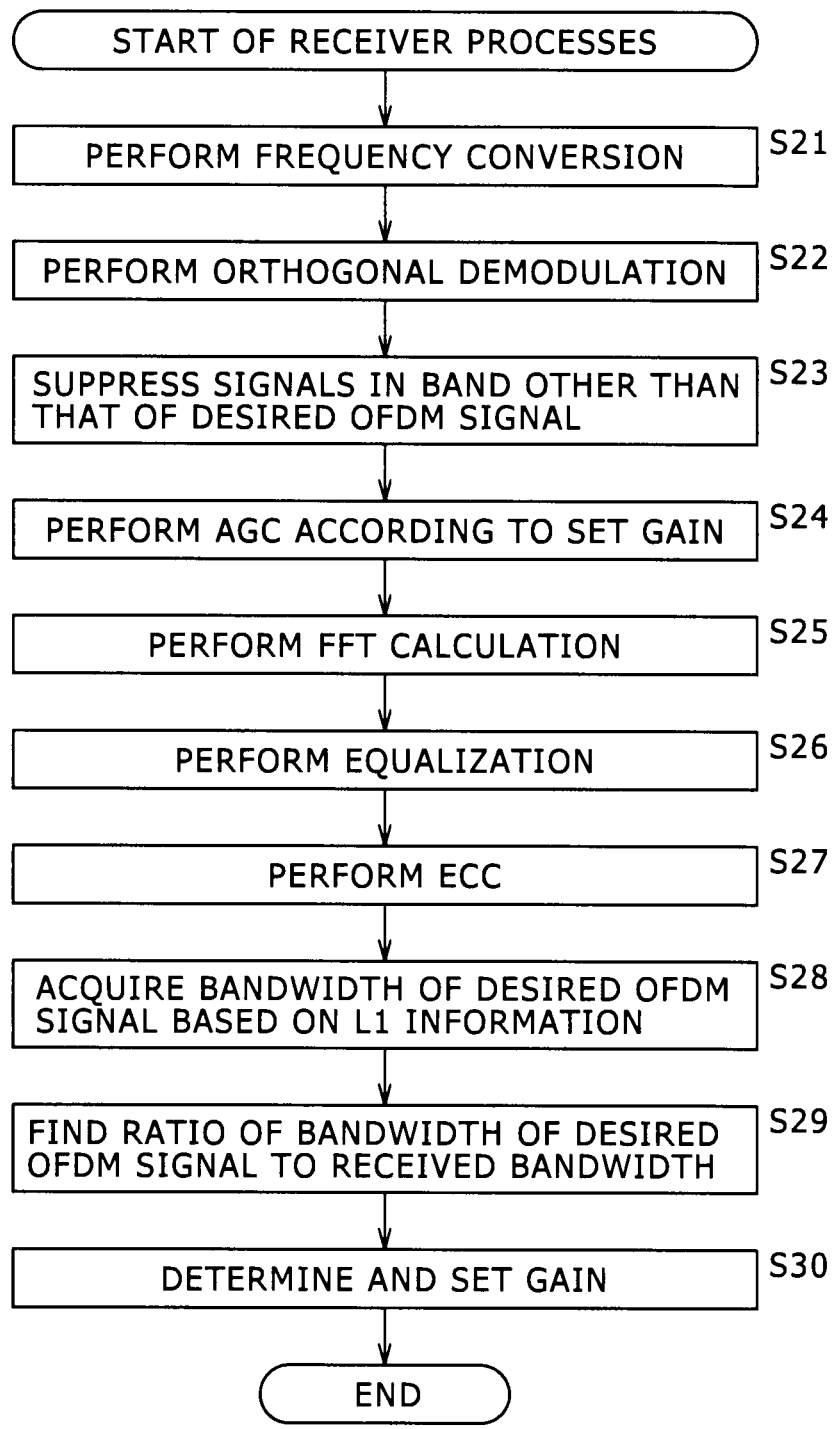
FIG. 12 is a flowchart describing the operation of the receiver shown in FIG. 11.

The processes shown in FIG. 12 are the same as those shown in FIG. 8 except that the orthogonal demodulation is performed prior to the AGC and that the signals in the band other than that of the desired OFDM signal are suppressed.

That is, in step S21, the frequency conversion block 21 of the RF tuner 11 converts the frequency of the RF signal.

In step S22, the orthogonal demodulation block 31 of the demodulation section 12 orthogonally demodulates the IF signal supplied from the frequency conversion block 21.

In step S23, the filtering block 41 filters the baseband signal obtained from the orthogonal demodulation performed by the orthogonal demodulation block 31, suppressing the signals in the band other than that of the desired OFDM signal. The position of the band other than that of the desired OFDM signal is identified based on information supplied from the desired bandwidth acquisition block 36.

In step S24, the AGC block 23 adjusts the power of the baseband signal supplied from the filtering block 41 according to the gain set by the gain determination block 37.

In step S25, the FFT calculation block 33 performs FFT calculation on the time-domain baseband signal supplied from the AGC block 23.

In step S26, the equalization block 34 equalizes the frequency-domain signal obtained from the FFT calculation.

In step S27, the ECC processing block 35 performs error correction decoding of the equalized signal.

In step S28, the desired bandwidth acquisition block 36 finds the bandwidth of the desired OFDM signal based on the L1 information.

In step S29, the gain determination block 37 finds the ratio of the bandwidth of the desired OFDM signal to the received bandwidth.

In step S30, the gain determination block 37 determines a gain commensurate with the ratio of the bandwidth of the desired OFDM signal to the received bandwidth, setting the AGC block 23 to the determined gain.

The above series of processes suppress external interference prior to the AGC, thus contributing to improved reception performance.

Modification Example

Although the gain is determined commensurate with the ratio of the bandwidth of the desired OFDM signal to the received bandwidth in the above description, the gain may be determined commensurate with the ratio of the power of the desired OFDM signal to the overall power of the received signal by finding the power of each of the signals in each frequency band of the received signal.

On the other hand, if a notch is included in the received band, and if the band of the desired OFDM signal is included only in part of the received band, a predetermined gain different from that used when there is no notch in the received band may be set in an across-the-board manner rather than setting the gain commensurate with the ratio of the bandwidth of the desired OFDM signal to the received bandwidth.

[Configuration Example of the Reception System]

Figure 13:
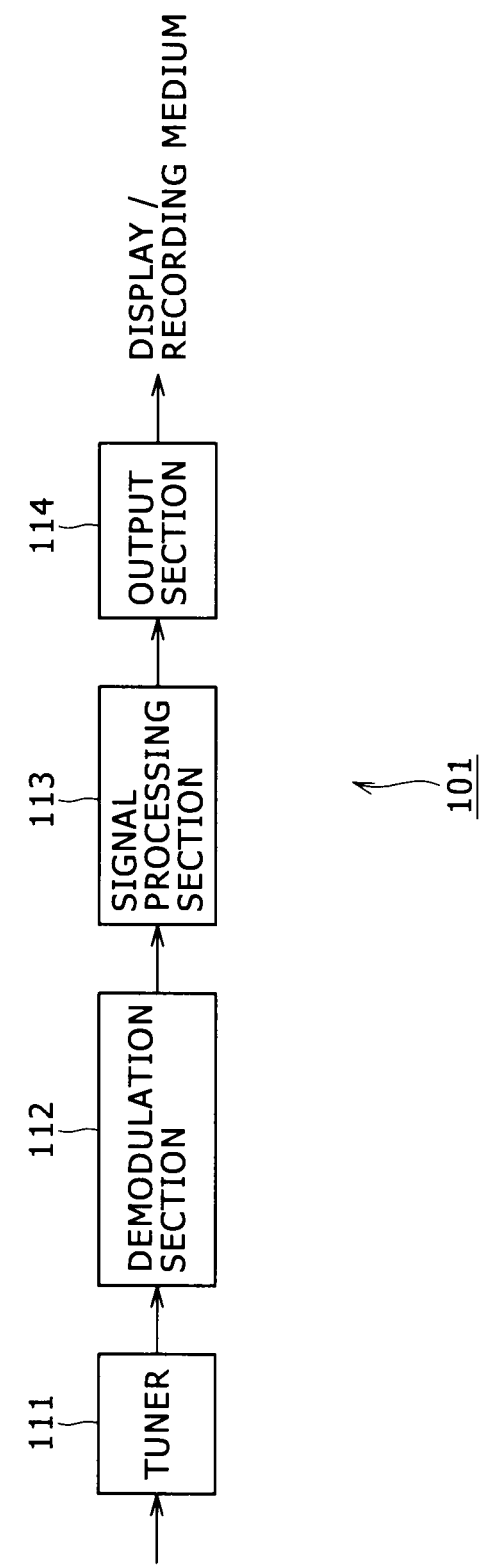
FIG. 13 is a diagram illustrating a configuration example of a reception system.

FIG. 13 is a block diagram illustrating a configuration example of a reception system to which the receiver 1 is applied.

A reception system 101 shown in FIG. 13 includes a tuner 111, demodulation section 112, signal processing section 113 and output section 114.

The tuner 111 receives a signal transmitted via a channel such as digital terrestrial broadcasting, digital satellite broadcasting, CATV (cable television) network or the Internet, outputting the received signal to the demodulation section 112. The RF tuner described above is included in the tuner 111.

The demodulation section 112 performs channel decoding of the signal supplied from the tuner 111 including demodulation and error correction, outputting the data obtained from the channel decoding to the signal processing section 113. The demodulation section 12 described above is included in the demodulation section 112.

The signal processing section 113 performs signal processing of the data obtained from the channel decoding including decompression and descrambling as appropriate, thus acquiring data to be transmitted. The MPEG decoder 13 described above is included in the signal processing section 113.

The signal processing section 113 performs decompression if video or audio data to be transmitted has been compressed, for example, according to MPEG or other scheme by the transmitting side. On the other hand, the signal processing section 113 performs descrambling if the data to be transmitted has been scrambled by the transmitting side. The signal processing section 113 outputs the data to be transmitted that has been processed as appropriate to the output section 114.

The output section 114 converts the data supplied from the signal processing section 113 to analog data if an image is displayed based on the data supplied from the signal processing section 113. The output section 114 outputs the image signal obtained from the D/A (Digital-to-Analog) conversion or other process to the display provided in the reception system 101 or that external to the reception system 101, thus displaying the image.

Further, if the data supplied from the signal processing section 113 is recorded to a recording medium, the output section 114 outputs the data supplied from the signal processing section 113 to the recording medium provided in the reception system 101 or to that provided outside the reception system 101 for recording. The recording medium includes, for example, a hard-disk, flash memory or optical disk. The recording medium provided outside the reception system 101 may be not only a recording medium external to the reception system 101 but also one that is connected via a network.

The reception system 101 having the configuration as described above may include hardware such as an IC (Integrated Circuit) chip. Alternatively, the reception system 101 may include a component such as a board that has a plurality of IC chips arranged thereon. Still alternatively, the reception system 101 may include a standalone device that includes the component.

Each of the tuner 111, demodulation section 112, signal processing section 113 and output section 114 can be configured as single standalone hardware or software module. Further, two or more of the tuner 111, demodulation section 112, signal processing section 113 and output section 114 may be combined as single standalone hardware or software module. For example, the tuner 111 and demodulation section 112 may together include a single piece of hardware, and the signal processing section 113 and output section 114 may together include a single piece of hardware.

The reception system 101 is applicable, for example, to a television set adapted to receive digital television broadcasting, a radio receiver adapted to receive radio broadcasting, and a recorder adapted to record television broadcasting.

[Configuration Example of the Computer]

The above series of processes may be performed by hardware or software. If the series of processes are performed by software, the program making up the software is installed from a program recording medium to a computer incorporated in dedicated hardware or a general-purpose personal computer.

FIG. 14 illustrates a block diagram illustrating a configuration example of computer hardware adapted to perform the above series of processes using a program.

A CPU (Central Processing Unit) 151, ROM (Read Only Memory) 152 and RAM (Random Access Memory) 153 are connected to each other via a bus 154.

An I/O (Input/Output) interface 155 is also connected to the bus 154. An input section 156 and output section 157 are connected to the I/O interface 155. The input section 156 includes, for example, a keyboard and mouse. The output section 157 includes, for example, a display and speaker. Further, a storage section 158, communication section 159 and drive 160 are also connected to the I/O interface 155. The storage section 158 includes, for example, a hard-disk or non-volatile memory. The communication section 159 includes, for example, a network interface. The drive 160 drives a removable medium 161.

In the computer configured as described above, the CPU 151 loads the program from the storage section 158 into the RAM 153 for execution via the I/O interface 155 and bus 154, thus performing the above series of processes.

The program executed by the CPU 151 can be recorded, for example, on the removable medium 161 or supplied via a wired or wireless transmission media such as local area network, the Internet or digital broadcasting, after which the program is installed to the storage section 158.

It should be noted that the program executed by the computer may perform the processes chronologically according to the sequence described in the present specification or perform the processes in parallel or when necessary as when invoked.

The embodiments of the present technology are not limited to those described above, but may be modified in various manners without departing from the scope of the present technology.

Modification Example (1)

There is provided a receiver including a determination block adapted to determine, as a gain used to adjust the power of a received signal received with a fixed bandwidth, a gain different from that used when other band is not contained in a band of the received signal if the band of the received signal contains a desired signal band and the other band.

(2)

In the receiver of feature (1), the determination block determines the gain used to adjust the power of the received signal based on a ratio of a bandwidth of the desired signal to a bandwidth of the received signal.

(3)

The receiver of feature (2) further includes an acquisition block adapted to acquire the bandwidth of the desired signal based on transmission control information transmitted together with the desired signal, wherein the determination block determines the gain using the bandwidth of the desired signal acquired by the acquisition block.

(4)

In the receiver of any one of features (1) to (3), the bandwidth of the received signal includes a bandwidth used to transmit the transmission control information.

(5)

The receiver of any one of features (1) to (4) further includes a reception section adapted to receive a signal with a fixed bandwidth in a predetermined frequency band, wherein the determination block determines the gain used to adjust the power of the received signal received by the reception section.

(6)

The receiver of any one of features (1) to (5) further includes a power adjustment block adapted to adjust the power of the received signal based on the gain determined by the determination block.

(7)

The receiver of feature (6) further includes a processing block adapted to suppress signals in the other bands, wherein the power adjustment block adjusts the power of the received signal in which the signals in the other bands have been suppressed.

(8)

In the receiver of any one of features (1) to (7), the received signal is a DVB-C2 modulated signal.

(9)

There is provided a reception method including determining, as a gain used to adjust the power of a received signal received with a fixed bandwidth, a gain different from that used when other band is not contained in a band of the received signal if the band of the received signal contains a desired signal band and the other band.

(10)

There is provided a program for causing a computer to perform a process including determining, as a gain used to adjust the power of a received signal received with a fixed bandwidth, a gain different from that used when other band is not contained in a band of the received signal if the band of the received signal contains a desired signal band and the other band.

(11)

There is provided a reception system including: a reception section adapted to receive a signal with a fixed bandwidth in a predetermined frequency band, the signal being transmitted via a channel; a demodulation section adapted to demodulate the received signal received by the reception section; a signal processing section adapted to perform signal processing of the data demodulated by the demodulation section to obtain data to be transmitted; and an output section adapted to output the data to be transmitted obtained by the signal processing section, wherein the demodulation section includes a determination block adapted to determine, as a gain used to adjust the power of the received signal received by the reception section, a gain different from that used when other band is not contained in a band of the received signal if the band of the received signal contains a desired signal band and the other band.

The present technology contains subject matter related to that disclosed in Japanese Priority Patent Application JP 2011-078821 filed in the Japan Patent Office on Mar. 31, 2011, the entire content of which is hereby incorporated by reference.

What is claimed is:

1. A receiver comprising:
a determination block adapted to determine, as a gain used to adjust the power of a received signal received with a fixed bandwidth, a gain different from that used when other band is not contained in a band of the received signal if the band of the received signal contains a desired signal band and the other band, wherein the determination block determines the gain used to adjust the power of the received signal based on a ratio of a bandwidth of the desired signal to the fixed bandwidth of the received signal; and
an acquisition block operable to acquire the bandwidth of the desired signal based on transmission control information transmitted together with the desired signal,
wherein the determination block determines the gain using the bandwidth of the desired signal acquired by the acquisition block.

2. The receiver of claim 1,
wherein the fixed bandwidth of the received signal includes a bandwidth used to transmit the transmission control information.

3. The receiver of claim 1, further comprising:
a reception section adapted to receive the received signal with the fixed bandwidth in a predetermined frequency band,
wherein the determination block determines the gain used to adjust the power of the received signal received by the reception section.

4. The receiver of claim 1, further comprising:
a power adjustment block adapted to adjust the power of the received signal based on the gain determined by the determination block.

5. The receiver of claim 4, further comprising:
a processing block adapted to suppress signals in the other band,
wherein the power adjustment block adjusts the power of the received signal in which the signals in the other band has been suppressed.

6. The receiver of claim 1,
wherein the received signal is a DVB-C2 modulated signal.

7. A reception method comprising:
determining, as a gain used to adjust the power of a received signal received with a fixed bandwidth, a gain different from that used when other band is not contained in a band of the received signal if the band of the received signal contains a desired signal band and the other band;
suppressing signals in the other band; and
adjusting the power of the received signal in which the signals in the other band have been suppressed.

8. A non-transitory computer-readable storage medium having stored thereon, a computer program having at least one code section executable by a computer for causing the computer to perform steps comprising:
determining, as a gain used to adjust the power of a received signal received with a fixed bandwidth, a gain different from that used when other band is not contained in a band of the received signal if the band of the received signal contains a desired signal band and the other band;
suppressing signals in the other band; and
adjusting the power of the received signal in which the signals in the other band have been suppressed.

9. A reception system comprising:
a reception section adapted to receive a signal with a fixed bandwidth in a predetermined frequency band, wherein the received signal is transmitted via a channel;
a demodulation section adapted to demodulate the received signal received by the reception section;
a signal processing section adapted to perform signal processing of the data demodulated by the demodulation section to obtain data to be transmitted;
an output section adapted to output the data to be transmitted obtained by the signal processing section,
wherein the demodulation section comprises a determination block adapted to determine, as a gain used to adjust the power of the received signal received by the reception section, a gain different from that used when other band is not contained in a band of the received signal if the band of the received signal contains a desired signal band and the other band; and an acquisition block adapted to acquire a bandwidth of a desired signal based on transmission control information transmitted together with the desired signal, wherein the fixed bandwidth of the received signal comprises a bandwidth used to transmit the transmission control information.

\* \* \* \* \*